United States Patent [19]
Yokotsuka et al.

[11] Patent Number: 5,190,891
[45] Date of Patent: Mar. 2, 1993

[54] METHOD FOR FABRICATING A SEMICONDUCTOR LASER DEVICE IN WHICH THE P-TYPE CLAD LAYER AND THE ACTIVE LAYER ARE GROWN AT DIFFERENT RATES

[75] Inventors: Tatsuo Yokotsuka, London, England; Akira Takamori, Atsugi; Masato Nakajima; Tomoko Suzuki, both of Kawasaki, all of Japan

[73] Assignee: Matsushita Electric Industrial Co., Ltd., Osaka, Japan

[21] Appl. No.: 710,483

[22] Filed: Jun. 5, 1991

[30] Foreign Application Priority Data

Jun. 5, 1990 [JP] Japan .................. 2-148299
Jun. 5, 1990 [JP] Japan .................. 2-148300

[51] Int. Cl.$^5$ .................. H01S 3/19; H01L 21/203
[52] U.S. Cl. .................. 437/129; 437/107; 437/133; 372/45; 257/18
[58] Field of Search .............. 437/129, 107, 133, 105; 372/45, 46; 357/16, 17

[56] References Cited

U.S. PATENT DOCUMENTS

| | | | |
|---|---|---|---|
| 4,901,326 | 2/1990 | Hayakawa et al. | 372/45 |
| 4,922,499 | 5/1990 | Nitta et al. | 372/46 |
| 4,974,231 | 11/1990 | Gomyo | 372/45 |
| 4,982,409 | 1/1991 | Kinoshita et al. | 372/45 |
| 4,987,096 | 1/1991 | Ishikawa et al. | 437/129 |
| 5,016,252 | 5/1991 | Hamada et al. | 372/45 |
| 5,048,035 | 9/1991 | Sugawara et al. | 372/46 |

FOREIGN PATENT DOCUMENTS

| | | | |
|---|---|---|---|
| 0456429 | 11/1991 | European Pat. Off. | 372/45 |
| 61-280694 | 12/1986 | Japan | 372/45 |
| 63-162598 | 7/1988 | Japan . | |
| 63-236314 | 10/1988 | Japan . | |
| 1-286480 | 11/1989 | Japan . | |
| 2-98984 | 4/1990 | Japan | 372/45 |
| 2-178918 | 7/1990 | Japan | 437/129 |

OTHER PUBLICATIONS

"Strong Ordering in GaInP Alloy Semiconductors: Formation Mechanism for the Ordered Phase" by T. Suzuki et al; Journal of Crystal Growth 93 (1988) pp. 396-405.

"661.7 nm Room-Temperature CW Operation of AlGaInP Double-Heterostructure Lasers with Aluminium-Containing Quaternary Active Layer" by K. Kobayashi et al, Electronics Letters, vol. 21, No.4, Nov. 21, 1985, pp. 1162-1163.

"0.66 μm Room-Temperature Operation of InGaAlP DH Laser Diodes Grown by MBE" by Y. Kawamura et al, Electronics Letters, vol. 19, No. 5, Mar. 3, 1983, pp. 163-165.

"Modular Beam Epitaxial Growth of AlGaInP on (100) GaAs" by T. Hayakawa, et al, Journal of Crystal Growth, vol. 95, No. 1-4, Feb. 1989, pp. 343-347.

"Evidence for the existence of an ordered state in GaInP grown by metalorganic vapor phase epitaxy and its relation to band-gap energy" by A. Gomyo, et al, Applied Physics Letters, vol. 50, No. 11 Mar. 16, 1987, pp. 673-675.

Primary Examiner—Mary Wilczewski
Attorney, Agent, or Firm—Lowe, Price, LeBlanc & Becker

[57] ABSTRACT

A method for fabricating a semiconductor laser device wherein a first clad layer is formed on a GaAs monocrystal substrate of one conductivity type. The first clad layer is made of a compound semiconductor of one conductivity type represented by the formula, $(Al_xGa_{1-x})_{0.5}In_{0.5}P$, wherein $0.4 \leq X \leq 1$. Then, an active layer of a compound semiconductor of the formula. $(Al_yGa_{1-y})_{0.5}In_{0.5}P$, wherein $0 \leq y \leq 0.35$ is formed on the first clad layer, on which a second clad layer of a compound semiconductor of the other conductivity type represented by the formula defined with respect to the first clad layer. At least one of the first and second clad layers is epitaxially grown at a rate of not larger than 0.5 μm/hour sufficient to form a monolayer superlattice structure therein and the active layer is epitaxially grown at a rate of not less than 2.0 μm/hour.

7 Claims, 3 Drawing Sheets

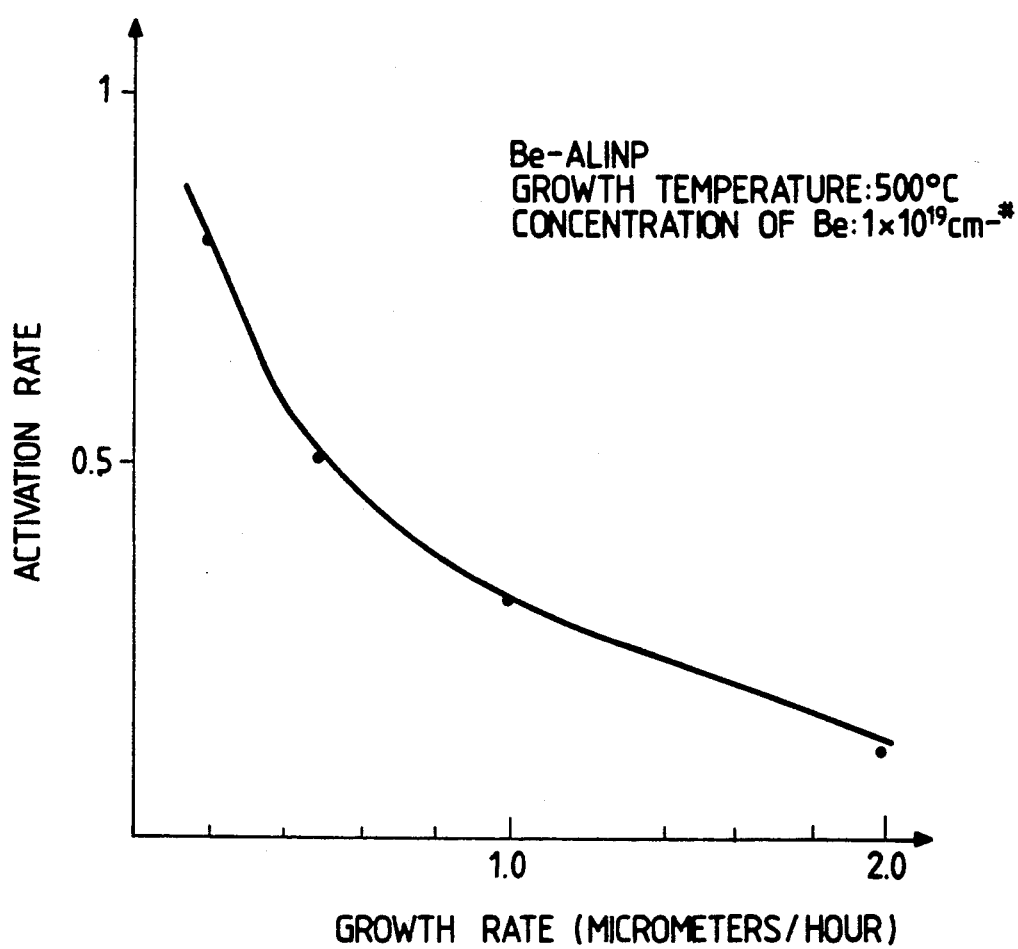

METHOD FOR FABRICATING A SEMICONDUCTOR LASER DEVICE IN WHICH THE P-TYPE CLAD LAYER AND THE ACTIVE LAYER ARE GROWN AT DIFFERENT RATES

BACKGROUND OF THE INVENTION

1. Field of the Invention

This invention relates to a method for fabricating a semiconductor laser device.

2. Description of the Prior Art

One of typical known materials for visible light semiconductor laser devices is $(Al_xGa_{1-x})_{0.5}In_{0.5}P$ wherein $0 \leq x \leq 1$. Among compound semiconductors of the elements of Group III-V of the Periodic Table, $(AlGa)_{0.5}In_{0.5}$ compounds exhibit the highest band gap energy except for nitrides of the element. Accordingly, they are usually applied as a semiconductor laser device capable of emitting light or beam a red color region. For the fabrication of a semiconductor laser device using $(AlGa)_{0.5}In_{0.5}P$, a GaAs substrate is first provided, on which the above compound semiconductors are epitaxially grown to form a compound semiconductor structure including a pair of clad layers sandwiching an active layer therebetween. The epitaxial growth is usually effected on the plane (001) of the GaAs substrate because of the ease in the preparation of such a substrate and also in the epitaxial growth. However, if GaInP is grown on the plane (001) of the substrate, a so-called "monolayer superlattice structure or ordered structure" is automatically formed wherein In atom-planes and Ga atom-planes are alternately arranged in the directions of $[\overline{1}1\overline{1}]$ and $[\overline{1}\overline{1}1]$ while intervening a P atom-plane therebetween.

This "monolayer superlattice structure" strongly appears in the vicinity of the growth temperature at which crystals of good quality are obtained. The completeness of the structure depends greatly on growth conditions including a feed ratio (i.e. ratio between the atoms of Group V and the atom of Group III), the growth temperature and the like. The area, in which the "monolayer superlattice" is formed, and the completeness of the arrangement depend on these conditions.

The formation of the "monolayer superlattice structure" has been observed not only in the GaInP/(001)GaAs system, but also in $(Al_xGa_{1-x})_{0.5}In_{0.5}P/(001)$GaAs systems. The "monolayer superlattice structure" has relation to the magnitude of band gap energy (Eg), the acceptor level (Ea) and the donor level (Ed). It is known that if the degree of the completeness of the arrangement becomes high, the values of Eg, Ea and Ed and becomes small. On the other hand, the low degree of the completeness results in large values of Eg, Ea and Ed.

In the semiconductor laser devices using the active layer and clad layers using GaIn or AlGaInP compounds, when the monolayer superlattice structure is formed, there appears a phenomenon where the lasing wavelength becomes longer than as expected from the layer compositions. For instance, with GaInP which is lattice-matched with a GaAs substrate, the band gap energy amounts to 1.91 eV, which corresponds to a wavelength of 649 nm. The lasing wavelength of a semiconductor laser device which has been fabricated using the GaInP ranges approximately from 670 to 680 nm. This means that the band gap energy becomes smaller by from 50 to 90 meV. The difference in the wavelength corresponds to a difference in the visibility by about ten times. This presents one of problems to solve under circumstances where there is a strong demand for shorter lasing wavelength. The problem is also involved in the case where AlGaInP is used as the active layer.

If the clad layer consisting of a GaInP or AlGaInP compound is doped at high concentrations, a so-called "disordering" takes place to destroy the "monolayer superlattice structure, resulting in crystals having an ordinary band gap energy. This entails larger values of Eg, Ea and Ed with the reduction of an apparent activity of the dopant. For example, AlInP is grown on a GaAs substrate according to gas source molecular beam epitaxy (GSMBE) while doping with a P-type beryllium dopant. The relation between the electrical activity (i.e. the ratio in concentration between the acceptor and Be) and the concentration of Be is shown in FIG. 1. The figure reveals that as the concentration of Be is increased, the electrical activity is abruptly decreased. The reason for this is considered as follows: the "monolayer superlattice structure" is disordered when the concentration of Be is in the range of from $1 \times 10^{-}$ to $2 \times 10 \, cm^{-3}$, so that the acceptor level becomes deep and thus, thermal excitation of positive holes takes place satisfactorily with the concentration of the holes being not increased.

For the fabrication of a semiconductor laser device, the clad layers become thick owing to the doping with a dopant. This leads to a high electric resistance in the layers to such an extent that most of the element resistance is concentrated on the clad portion. At the clad portion, the Joule heat is generated with the attendant problem that the power consumption is increased along with an increase of threshold current.

On the other hand, the control of the formation of the "monolayer superlattice structure" with the feed source ratio (element of Group V/elements of Group III) has the following problems.

FIG. 2 shows a variation curve of band gap energy, Eg, for different growth conditions used in an metalorganic vapor phase epitaxy (MOVPE). As will be seen from the figure, when the feed source ratio is made low and the growth temperature is made high (at a level higher than 700° C.), the band gap energy reaches about 1.9 eV which is inherent to the compound semiconductor, GaInP. Thus, the short lasing wavelength can be realized. However, when the growth temperature is made so high that there is obtained a band gap energy of 1.9 eV, there arises the problem that the light emission efficiency is lowered due to the high temperature.

SUMMARY OF THE INVENTION

It is accordingly an object of the invention to provide a method for fabricating a semiconductor laser device which solve the problems involved in the prior art techniques and can provide a semiconductor laser device having good working characteristics.

It is another object of the invention to provide a method for fabricating a semiconductor laser device which is free of any adverse influence of the "monolayer superlattice structure" as will be formed in prior art processes and can be worked reliably at low power consumption at a short lasing wavelength.

According to the invention, there is provided a method for fabricating a semiconductor laser device which comprises:

providing a GaAs monocrystal substrate of one conductivity type;

epitaxially growing a first clad layer of a compound semiconductor of one conductivity type represented by the formula, $(Al_xGa_{1-x})_{0.5}In_{0.5}P$, wherein $0.4 \leq x \leq 1$, on a plane (001) of the substrate;

epitaxially growing, on the first clad layer, an active layer of a compound semiconductor of the formula, $(Al_yGa_{1-y})_{0.5}In_{0.5}P$, wherein $0 \leq y \leq 0.35$ provided that x and y are so selected that the value of (x−y) is not less than 0.4, the active layer being grown at a rate of not less than 2.0 μm/hour; and epitaxially growing, on the active layer, a second clad layer of a compound semiconductor of the other conductivity type represented by the formula defined with respect to the first clad layer, at least one of the first and second clad layers which is of a p-type conductivity being grown at a rate of not less than 0.5 μm/hour sufficient to form a monolayer superlattice structure therein.

The growth rates of the first and second clad layers are preferably in the range of not larger than 0.5 μm/hour.

BRIEF DESCRIPTION OF THE DRAWINGS

FIG. 4 is a graph showing the electrical activity of a Be dopant of Be-doped AlInP grown by gas source molecular beam epitaxy of the invention.

DETAILED DESCRIPTION AND EMBODIMENTS OF THE INVENTION

Figure 1:
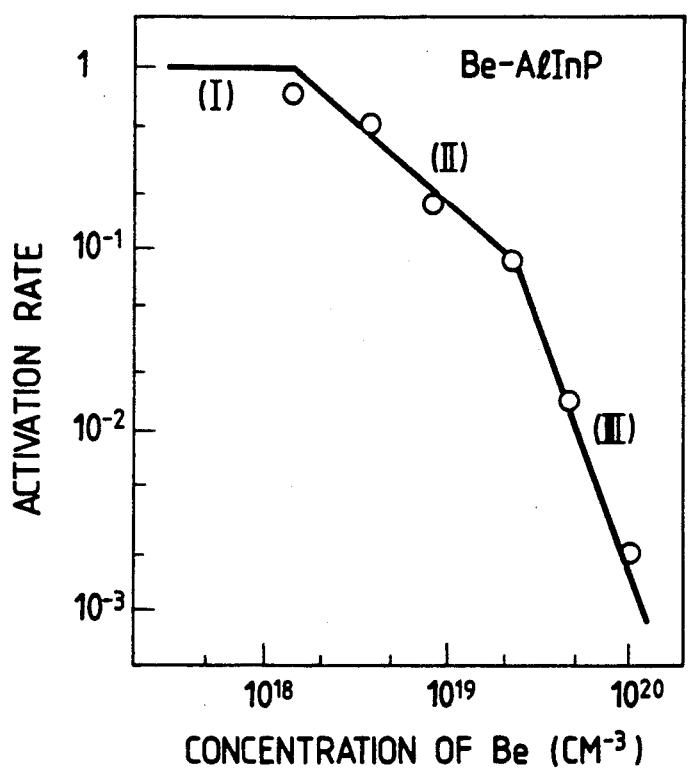
FIG. 1 is a graph showing the relation between the electrical activity and the concentration of Be in a Be-doped AlInP layer grown by gas source molecular beam epitaxy.
Figure 2:
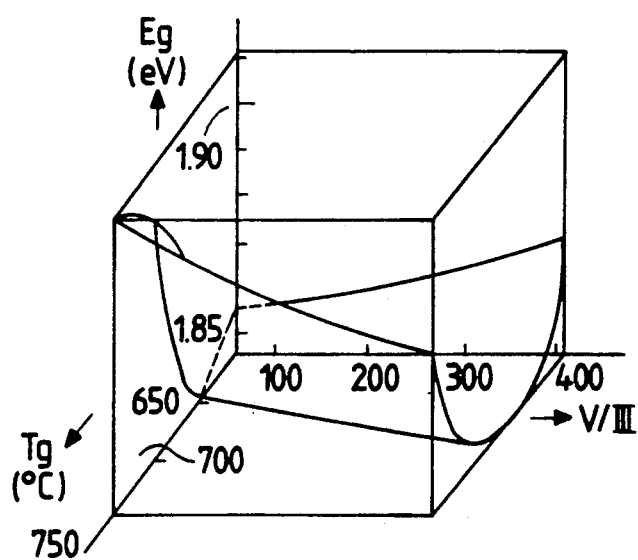
FIG. 2 is a graph showing the relation between the growth temperature of GaInP formed by metal organic vapor phase epitaxy, the ratio of an element of Group V and an elements of Group III and the energy band gap obtained by photoluminescent measurement.

In the method of the invention, a GaAs monocrystal substrate of one conductivity type is first provided. Prior to formation of a clad layer, the substrate is treated by a usual manner, e.g. it is washed with an organic solvent and then with water, followed by etching with an acid solution in order to remove strain from the surface thereof. The substrate is further subjected to removal of an oxide film from the surface in an atmosphere of a vapor such as of As at an appropriate temperature of from 500° to 550° C.

A first clad layer of one conductivity type is subsequently formed on the plane (001) of the substrate by a gas source molecular beam epitaxy using solid gallium having a purity of 99.99999% and solid indium having a purity of 99.99999% as the elements of Group III and also $P_2$ obtained by thermal decomposition of phosphine gas ($PH_3$) having a purity of 100%. The epitaxy is carried out at a reduced pressure of $5 \times 10^{-5}$ to $1 \times 10^{-(-4)}$ Torr. The clad layer formed should have a composition of the formula, $(Al_xGa_{1-x})_{0.5}In_{0.5}P$, where $0.4 \leq x \leq 1$.

The conductivity of the clad layer may be either of the n type or the p-type. For the n-type conductivity, Si, or the like impurity may be doped at a level of 2 to $50 \times 10^{17}$ cm$^{-3}$. Similarly, for the p-type conductivity, an impurity such as Be, Mg or the like may be doped at a level of 2 to $50 \times 10^{17}$ cm$^{-3}$.

In the practice of the invention, it is important that the formation of the "monolayer superlattice structure" be controlled by controlling the growing rates of the first and second clad layers and an active layer provided therebetween. More particularly, for the clad layers, the formation of the superlattice structure" is necessary. On the contrary, for the active layer, such formation is rather undesirable for the reason discussed hereinafter.

In prior art, the control of the formation has relied on the type of dopant used and the control of the feed source ratio between the element of Group V and the elements of Group III and the like.

The clad layer is made of the AlGaInP which is doped with an impurity. When the concentration of the dopant is increased to a range of $1 \times 10^{18}$ to $1 \times 10^{19}$ cm$^{-3}$, the electrical activity is lowered due to disordering of the "monolayer superlattice structure". By the disordering, the acceptor level becomes so deep that positive holes cannot be not thermally excited sufficiently. Thus, the number of the holes are not increased. The electrical activity can be increased by controlling the growing rate of the clad layer. In other words, the clad layers, particularly, a p-type clad layer, should be formed to have the "monolayer superlattice structure". In order to attain a complete arrangement of the "monolayer superlattice structure, the p-type clad layer should be grown at a rate of not larger than 0.5 μm/hour, preferably not larger than 0.2 μm/hour, and more preferably from 0.1 to 0.2 μm/hour. When the clad layer is of the n-type conductivity, a high activity is attained easier than in the case of the p-type clad layer because of the physical aspect of the n-type clad layer. However, a high electrical activity is difficult to obtain for the p-type clad layer. More particularly, with the p-type clad layer suitable for emitting a red color beam or light, the formation of the "monolayer superlattice structure" requires a slow growth rate as defined above although the activity of about 1 is obtained for the n-type clad layer at a growth rate of not larger than 1 μm/hour.

It will be noted that a buffer layer made, for example, of GaAs may be provided between the substrate and the first clad layer.

On the first clad layer, which is either of the n-type or the p-type conductivity, is further formed an active layer. The active layer is epitaxially grown by use of a compound semiconductor of the formula, $(Al_yGa_{1-y})_{0.5}In_{0.5}P$, wherein $0 \leq y \leq 0.35$. In practice, the value of y is so selected that the value of x for the semiconductor used as the clad layer minus the value of y is not less than 0.4. By this, a satisfactory band gap between the clad layer and the active layer is ensured.

The active layer should be grown at a rate higher than the clad layer. As stated above, the completeness in arrangement of the "monolayer superlattice structure" depends greatly on the growth rate of crystals. If the growth rate is high, the degree of the completeness is lowered. This is because the elements of Group III arriving at the growing surface have to be in position of atom sites forming the "monolayer superlattice structure" after movement through the surface, so that the time required for bonding the crystallization of the phosphorus atoms arriving at the surface becomes shorter than an average time necessary for the completeness. Accordingly, when the growth rate of the active layer is larger, the reduction in the band gap due to the ordering of the crystals derived from the "monolayer superlattice structure" is prevented. As a result, an inherent band gap is obtained, making it possible to make a short lasing wavelength of the resultant semiconductor laser device.

The growth rate of the active layer should preferably be not less than 2.0 μm/hour, more preferably not less than 3.0 μm/hour and most preferably from 3.0 μm to 5.0 μm/hour.

The active layer is lattice matched with the plane (001) of the substrate.

For the formation of the active layer, the elements of Group III and the element of Group V are provided at a predetermined ratios in the same manner as for the first clad layer and epitaxially grown by molecular beam epitaxy under conditions of a temperature of from 450° to 530° C. at a reduced pressure of from $5\times10^{-5}$ to $1\times10^{-4}$ Torr. The band gap energy of the active layer can be varied within a range of 1.85 eV to 1.91 eV.

Thereafter, a second clad layer, which is opposite in the conductivity type to the first layer, is formed on the active layer in the same manner as the first clad layer while care should be taken to the growth rate depending on the conductivity type. The semiconductor having the same composition as in the first clad layer is used except that an impurity capable of imparting the other conductivity type is doped in the compound semiconductor used for the second clad layer. With respect to the conductivity type, if the substrate is made of an n-type semiconductor, the first clad layer should be made of an n-type semiconductor and the second clad layer should be made of a p-type semiconductor. If the substrate is of the p-type, the first clad layer should be of the p-type and the second clad layer should of the n-type. As set out above, at least a p-type clad layer should be grown at a rate of not larger than 0.5 μm/hour. Preferably, both clad layers are grown at a rate of not more than 0.5 μm/hour.

The semiconductor laser device where the active layer and the first and second clad layers are formed in such a way as set forth above, a short lasing wavelength of 650 to 660 nm is ensured and the device has a low threshold value, a low power consumption, a high operation temperature and good reliability.

The active layer and the first and second clad layers may be formed by molecular beam epitaxial techniques including not only gas source MBE, but also metal organic molecular beam epitaxy (MOMBE), chemical beam epitaxy (CBE) and metalorganic vapor phase epitaxy (MOVPE). The thickness of the active layer is generally in the range of from 0.04 to 0.1 μm and the thickness of the first and second clad layers is generally in the range of from 0.6 to 1.0 μm.

The present invention is more particularly described by way of example.

EXAMPLE 1

A GaAs substrate which had been washed with trichloroethane, acetone or methanol and then with water was provided. The substrate was etched with a mixed solution of $H_2SO_4$, $H_2O_2$ and $H_2O$ at a mixing ratio by volume of 3:1:1 in order to remove the surface strain produced during processing. The GaAs substrate was placed in a molecular beam epitaxy chamber and subjected to treatment in an atmosphere of As at a temperature of from 500° to 550° C. to remove an oxide film from the surface thereof.

The thus treated substrate was maintained at 600° C. on which GaAs was grown in a thickness of about 0.2 μm as a buffer layer.

Thereafter, a first clad layer of $(Al_xGa_{1-x})_{0.5}In_{0.5}P$ where $0.4 \leq x \leq 1$ doped with Si at a concentration of $1\times10^{-}cm^{-3}$ was formed on the buffer layer in a thickness of 0.8 μm at a growth rate of 1.0 μm/hour while lattice matching with the (001) plane of the substrate.

While the substrate was kept at 500° C. $Ga_{0.5}In_{0.5}P$ single crystals where formed on the plane (001) of the substrate as an active layer at a rate of 3 μm/hour to a thickness of about 1 μm.

A second clad layer was formed in the same manner as the first clad layer except that an impurity of Be was doped at a concentration of $1\times10^{18}$ cm$^{-3}$.

The compound semiconductors for the active layer and the first and second clad layers were formed according to a gas source molecular beam epitaxial procedure using solid gallium having a purity of 99.99999% maintained at 930° C. solid indium having a purity of 99.99999% maintained at 730° C. and $P_2$ obtained by thermal decomposition of 100% phosphine ($PH_3$) gas at 900° C. under conditions of about $8\times10^{-5}$ Torr.

Figure 3:
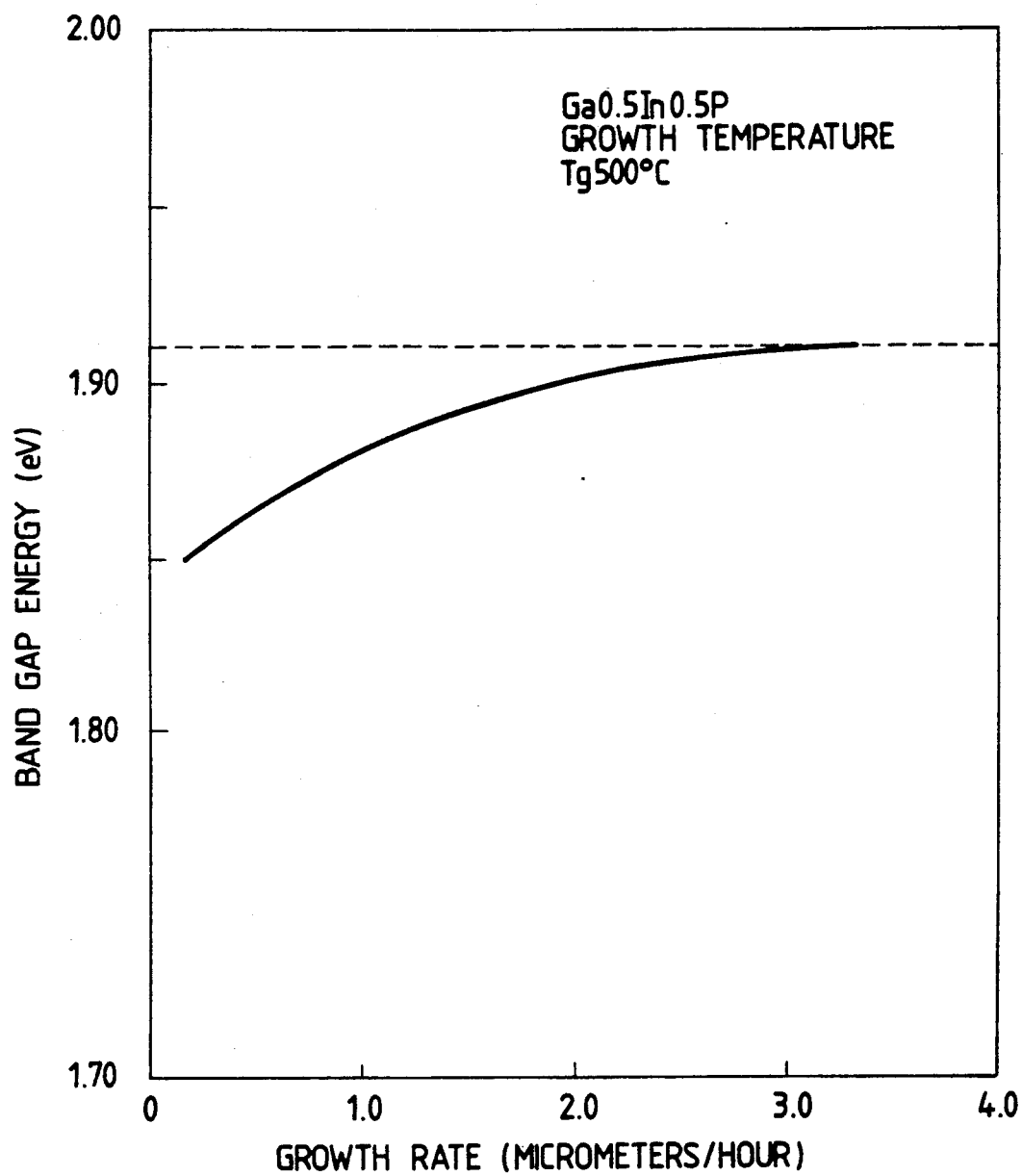
FIG. 3 is a graph showing the relation between the band gap energy, Eg, and the growth rate of GaInP grown by gas source molecular beam epitaxy according to the invention.

The above procedure was repeated using a growth rate of the active layer ranging from 0.1 to 4.0 μm. The relation between the band gap energy and the growth rate is shown in FIG. 3.

From the figure, it will be seen that the band gap energy is changed from 1.85 eV to 1.19 eV. When the growth rate was not less than about 3 μm/hour, the band gap energy reached approximately 1.9 eV which is inherent to $Ga_{0.5}In_{0.5}P$. It will be noted that when the growth rate was about 2 μm, the band gap energy was about 1.9 eV. The laser beam emitted at 650 nm could be obtained.

Although $Ga_{0.5}In_{0.5}P$ was used in the above example, similar results are obtained when there are used the compound semiconductor of the formula, $(Al_yGa_{1-y})_{0.5}In_{0.5}P$, wherein $0 \leq y \leq 0.35$.

As will be apparent from the above example, when the growth rate is made higher than the clad layer and is sufficient for disordering the "monolayer superlattice structure", the reduction of the band gap can be prevented, so that a short lasing wavelength is attained.

EXAMPLE 2

This example illustrates the electrical activity of a clad layer of a p-type conductivity doped with Be by changing a growth rate of the clad layer.

In the same manner as in Example 1, the buffer layer was formed on the GaAs substrate, on which $Al_{0.5}In_{0.5}P$ was grown at a temperature of 500° C. while doping with a Be concentration of $1\times10^{19}$ cm$^{-3}$ at a growth rate of from 0.1 μm to 2.0 μm.

The activity of the p-type clad layer was determined by the Hall measurement and a secondary ion mass spectrometry (SIMS).

The relation between the electrical activity and the growth rate is shown in FIG. 4.

From the figure, it will be seen that when the growth rate is at 0.2 μm/hour, the electrical activity is about 0.8. Where Be is doped, an appropriate concentration of holes is ensured. When the growth rate is about 0.1 μm/hour, the electrical activity is closer to 1. At a growth rate of 0.5 μm/hour, the activity is 0.5. However, if the rate is below 0.1 μm, it will take a relatively long time.

When the growth rate was 0.2 μm/hour, the resistivity is changed from 0.3 Ω·cm obtained at a growth rate of 1 μm/hour, to 0.1 Ω·cm. At a growth rate of 0.5 μm/hour, the resistivity is lower than 0.3 Ω·cm attained at a growth rate of 1 μm/hour and is close to 0.1 Ω·cm with little problem in practical application. If the activity is 0.5 or over, a satisfactory low resistivity is obtained. This is why the growth rate of at least the p-type clad layer is defined as not large than 0.5 μm/hour. As a matter of course, with an n-type clad layer doped such as with Si, the growth rate of not larger than 0.5 μm gives favorable results and is preferably determined as such.

The results of the examples are summarized in the following table.

TABLE

| Growth Rate of Clad Layer (μm/hour) | Growth Rate of Active Layer (μm/hour) | | | | |
|---|---|---|---|---|---|
| | 0.1 | 0.5 | 1.0 | 2.0 | 3.0 or over |
| 0.1 | very bad | very bad | moderate | good | very good |
| 0.2 | very bad | very bad | moderate | good | good |
| 0.5 | very bad | very bad | moderate | good | good |
| 1.0 | very bad | very bad | moderate | moderate | moderate |
| 2.0 | very bad | very bad | very bad | very bad | very bad |

From the above table, it will be seen that good results are obtained when the growth rate of the clad layer is not larger than 0.5 μm/hour, preferably not larger than 0.2 μm/hour and more preferably from 0.1 to 0.2 μm/hour and and also when the growth rate of the active layer is not less than 2.0 μm/hour, preferably not less than 3.0 μm/hour. Within these ranges, the resultant semiconductor laser device can be excited at a short wavelength of about 649 nm.

If a gas source molecular beam epitaxial technique is used, the growth rate is most preferably from 3.0 to 5.0 μm in consideration of the crystallinity of the active layer

What is claimed is:

1. A method for fabricating a semiconductor laser device which comprises:
   providing a GaAs monocrystal substrate of one conductivity type;
   epitaxially growing a first clad layer of a compound semiconductor of one conductivity type represented by the formula, $(Al_xGa_{1-x})_{0.5}In_{0.5}P$, wherein $0.4 \leq x \leq 1$, on a plane (001) of the substrate;
   epitaxially growing, on the first clad layer, an active layer of a compound semiconductor of the formula, $(Al_yGa_{1-y})_{0.5}In_{0.5}P$, wherein $0 \leq y \leq 0.35$ provided that x and y are so selected that the value of (x−y) is not less than 0.4, said active layer being grown at a rate of not less than 2.0 μm/hour; and
   epitaxially growing, on the active layer, a second clad layer of a compound semiconductor of the other conductivity type represented by the formula defined with respect to the first clad layer, at least one of the first and second clad layers, which is of a p-type conductivity, being grown at a rate of not larger than 0.5 μm/hour sufficient to form a monolayer superlattice structure therein.

2. The method according to claim 1, wherein the growth rate of said at least one clad layer is not larger than 0.2 μm/hour.

3. The method according to claim 1, wherein the growth rate of both first and second clad layers is not larger than 0.5 μm/hour.

4. The method according to claim 3, wherein the growth rate of both first and second clad layers is not larger than 0.2 μm/hour.

5. The method according to claim 1, wherein the growth rate of the active layer is not less than 3.0 μm.

6. The method according to claim 5, wherein the growth rate of the active layer is within a range of from 3.0 μm to 5.0 μm.

7. The method according to claim 1, wherein one of the first and second clad layers which is of the p-type conductivity is doped with Be.

* * * * *